US011868654B2

United States Patent
Moriyasu et al.

(10) Patent No.: US 11,868,654 B2
(45) Date of Patent: Jan. 9, 2024

(54) SEMICONDUCTOR DEVICE

(71) Applicant: RENESAS ELECTRONICS CORPORATION, Tokyo (JP)

(72) Inventors: Takanori Moriyasu, Tokyo (JP); Kazuo Yoshihara, Tokyo (JP); Takayuki Nishiyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 55 days.

(21) Appl. No.: 17/318,525

(22) Filed: May 12, 2021

(65) Prior Publication Data

US 2021/0357152 A1    Nov. 18, 2021

(30) Foreign Application Priority Data

May 15, 2020    (JP) .................. 2020-086359

(51) Int. Cl.
*G06F 3/06*    (2006.01)
*G11C 16/04*    (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC .... G06F 3/0659; G06F 3/0604; G06F 3/0679; G11C 16/0433; G11C 16/10; G11C 16/3459
See application file for complete search history.

(56) References Cited

U.S. PATENT DOCUMENTS 9,093,132 B2 *   7/2015   Kim .................... G11C 7/1063
10,026,491 B2    7/2018   Utsunomiya et al.
(Continued)

FOREIGN PATENT DOCUMENTS

JP    63-117396 A    5/1988
JP    2008-034045 A    2/2008
(Continued)

OTHER PUBLICATIONS

Extended European Search Report issued in corresponding European Patent Application No. 21173982.6-1203, dated Oct. 14, 2021.
(Continued)

*Primary Examiner* — Idriss N Alrobaye
*Assistant Examiner* — Richard B Franklin
(74) *Attorney, Agent, or Firm* — McDermott Will & Emery LLP

(57) ABSTRACT

A semiconductor device includes: a nonvolatile memory cell including first memory cells and second memory cells; a bit latch; and a saved register. In a first writing operation, first writing data are stored in the bit latch and the saved register, and writing to the first memory cells is executed based on the first writing data. During the first writing operation, the first writing operation is interrupted based on a suspension command, and a second writing operation is executed. In the second writing operation, second writing data are stored in the bit latch, and writing to the second memory cells is executed based on the second writing data. After the second writing operation is ended, the first writing data is reset to the bit latch based on a resume command, and the interrupted first writing operation is restarted based on the first writing data reset to the bit latch.

8 Claims, 18 Drawing Sheets

(51) Int. Cl.
    *G11C 16/10*     (2006.01)
    *G11C 16/34*     (2006.01)
(52) U.S. Cl.
    CPC .......... *G11C 16/0433* (2013.01); *G11C 16/10* (2013.01); *G11C 16/3459* (2013.01)

(56)          References Cited

U.S. PATENT DOCUMENTS 10,140,062 B1     11/2018  Pedersen
    10,325,658 B2      6/2019  Lee
    10,777,239 B2      9/2020  Sato et al.
    11,164,643 B2 *   11/2021  Kim ................... G11C 16/0483
    11,348,648 B2 *    5/2022  Harada ................ G11C 16/10

FOREIGN PATENT DOCUMENTS

JP         2013109823 A      6/2013
    JP         2018-045741 A     3/2018
    JP         2019-204565 A    11/2019

OTHER PUBLICATIONS

Notice of Reasons for Refusal in Japanese Application No. 2020-086359, dated Oct. 31, 2023.

\* cited by examiner

FIG. 4

|  | Vd | Vcg | Vmg | Vs |
|---|---|---|---|---|
| PROG | 0.5V | 1V | 10V | 5V |
| ERASE | 0V | 0V | -10V | 5V |
| READ | 1V | 1V | 0V | 0V |

FIG. 9

| Status FLM | Process | Latched DATA |
|---|---|---|
| PROGRAM | START | - |
| | P1 | A |
| | P2(1st) | A |
| | P3(1st) | B |
| | P4 | B |
| | P2(2nd) | B |
| | S5 | B |
| | S6 | B |
| | S7 | B |
| | S8 | B |
| | END | B |
| PROGRAM during PROGRAM suspend | START | B |
| | P1 | D |
| | P2 | D |
| | P3 | D |
| | P4 | E |
| | END | E |

FIG. 10

| Status FLM | Process | Latched DATA |
|---|---|---|
| PROGRAM | START | - |
| | P1 | A |
| | P2(1st) | A |
| | P3(1st) | B |
| | P4 | B |
| | P2(2nd) | B |
| | S5 | B |
| | S6 | B |
| | S7 | B |
| | S8 | B |
| | END | B |
| ERASE during PROGRAM suspend | START | B |
| | E1 | All 0 |
| | E2 | All 0 |
| | E3 | All 0 |
| | E4 | All 0 |
| | END | All 0 |

FIG. 13

| Status FLM | Process | Latched DATA |
|---|---|---|
| PROGRAM | START | - |
| | P1 | A |
| | P2(1st) | A |
| | P3(1st) | B |
| | P4 | B |
| | P2(2nd) | B |
| | S5 | B |
| | S6 | B |
| | S7 | B |
| | S8 | B |
| | END | B |
| PROGRAM during PROGRAM suspend | START | B |
| | P1 | D |
| | P2 | D |
| | P3 | E |
| | P4 | E |
| | END | E |
| Resume | SS9 | E |
| | SS10 | E |
| | SS11 | A |
| | SS12 | C |
| | SS13 | C |
| | SS14 | C |
| | SS15 | C |
| PROGRAM | P3 | C |
| | P4 | C |
| | END | C |

FIG. 15

| Status FLM | Process | Latched DATA |
|---|---|---|
| PROGRAM | START | - |
| | P1 | A |
| | P2(1st) | A |
| | P3(1st) | B |
| | P4 | B |
| | P2(2nd) | B |
| | S5 | B |
| | S6 | B |
| | S7 | B |
| | S8 | B |
| | END | B |
| PROGRAM during PROGRAM suspend | START | B |
| | P1 | D |
| | P2 | D |
| | P3 | E |
| | P4 | E |
| | END | E |
| Resume | S9 | B |
| | S10 | B |
| | S11 | B |
| | S12 | B |
| PROGRAM | P3 | C |
| | P4 | C |
| | END | C |

FIG. 18

| Status FLM | Process | Latched DATA |
|---|---|---|
| PROGRAM | START | - |
| | P1 | A |
| | P2(1st) | A |
| | P3(1st) | B |
| | P4 | B |
| | P2(2nd) | B |
| | S5 | B |
| | S6 | B |
| | S7 | B |
| | S8 | B |
| | END | B |
| PROGRAM during PROGRAM suspend | START | B |
| | P1 | D |
| | P2 | D |
| | P3 | E |
| | P4 | E |
| | END | E |
| Resume | SS9 | E |
| | SS10 | E |
| | SS11 | B |
| | SS13 | B |
| | SS14 | B |
| | SS15 | B |
| PROGRAM | P3 | C |
| | P4 | C |
| | END | C |

SEMICONDUCTOR DEVICE

CROSS-REFERENCE TO RELATED APPLICATIONS

The disclosure of Japanese Patent Application No. 2020-086359 filed on May 15, 2020 including the specification, drawings and abstract is incorporated herein by reference in its entirety.

BACKGROUND

The present disclosure relates to a semiconductor device. In particular, the present disclosure relates to a technique that is effective by being applied to a semiconductor device including a nonvolatile memory and a central processing unit.

In a semiconductor device provided with a plurality of masters (for example, a plurality of central processing units (CPUs)), each master may be configured so as to share a flash memory that is one nonvolatile memory. In the semiconductor device having such a configuration, for example, a memory controller controls access of each master to the flash memory.

Japanese Unexamined Patent Application Publication No. 2008-34045 discloses a technique of interrupting and restarting a writing/erasing process against a flash memory.

There are disclosed techniques listed below.
[Patent Document 1] Japanese Unexamined Patent Application Publication No. 2008-34045

SUMMARY

In the semiconductor device provided with the plurality of central processing units (CPUs), in a case where a writing/erasing operation against the flash memory compete against each other, it is necessary to wait until one process that was executed previously is completed even though the other process is a process with high priority.

In the future, when the number of central processing units (CPUs) provided in one semiconductor device increases, that is, when multi-CPU cores progress, it is necessary to minimize the division of a flash memory with a large area impact in order to keep cost down. As a result, it is considered that the number of divisions of the flash memory (the number of banks) is reduced, and it becomes a state of the number of CPU cores>the number of banks in the flash memory. Therefore, it is expected that competition of a writing operation and an erasing operation against the same flash memory (one bank) will become significant.

It is an object of the present disclosure to provide a technique capable of executing a writing operation or an erasing operation while a writing operation against one flash memory is suspended or while an erasing operation thereto is suspended.

The other object and new feature will become apparent from description of the present specification and the accompanying drawings.

BRIEF DESCRIPTION OF THE DRAWINGS

An outline of representative invention of the present disclosure will briefly be explained as follows.

According to one embodiment, there is a semiconductor device including:
 a nonvolatile memory cell including a plurality of first memory cells and a plurality of second memory cells;
 a bit latch; and
 a saved register.

In a first writing operation, first writing data are stored in the bit latch and the saved register, and writing to the plurality of first memory cells is executed on a basis of the first writing data stored in the bit latch.

During the first writing operation, the first writing operation is interrupted on a basis of a suspension command, and a second writing operation is executed.

In the second writing operation, second writing data are stored in the bit latch, and writing to the plurality of second memory cells is executed on a basis of the second writing data.

After the second writing operation is ended, the first writing data of the saved register is reset to the bit latch on a basis of a resume command, and the interrupted first writing operation is restarted on a basis of the first writing data reset to the bit latch. Further, according to another embodiment, there is provided a semiconductor device including:
 a nonvolatile memory cell including a plurality of first memory cells and a plurality of second memory cells;
 a first bit latch; and
 a second bit latch.

In a first writing operation, first writing data are stored in the first bit latch, and writing to the plurality of first memory cells is executed on a basis of the first writing data stored in the first bit latch.

During the first writing operation, the first writing operation is interrupted on a basis of a suspension command, and a second writing operation is executed.

In the second writing operation, second writing data are stored in the second bit latch, and writing to the plurality of second memory cells is executed on a basis of the second writing data.

After the second writing operation is ended, the interrupted first writing operation is restarted on a basis of a resume command and latched data of the first bit latch.

Moreover, according to still another embodiment, there is provided a semiconductor device including:
 a nonvolatile memory cell including a plurality of first memory cells and a plurality of second memory cells;
 a bit latch; and
 a saved register.

In a first writing operation, first writing data are stored in the bit latch, and writing to the plurality of first memory cells is executed on a basis of the first writing data stored in the bit latch.

During the first writing operation, the first writing operation is interrupted on a basis of a suspension command, data on the bit latch are saved in the saved register, and a second writing operation is executed.

In the second writing operation, second writing data are stored in the bit latch, and writing to the plurality of second memory cells is executed on a basis of the second writing data.

After the second writing operation is ended, the data saved in the saved register are reset to the bit latch on a basis of a resume command, and the interrupted first writing operation is restarted on a basis of the data reset to the bit latch.

BRIEF DESCRIPTION OF THE DRAWINGS

Figure 1:
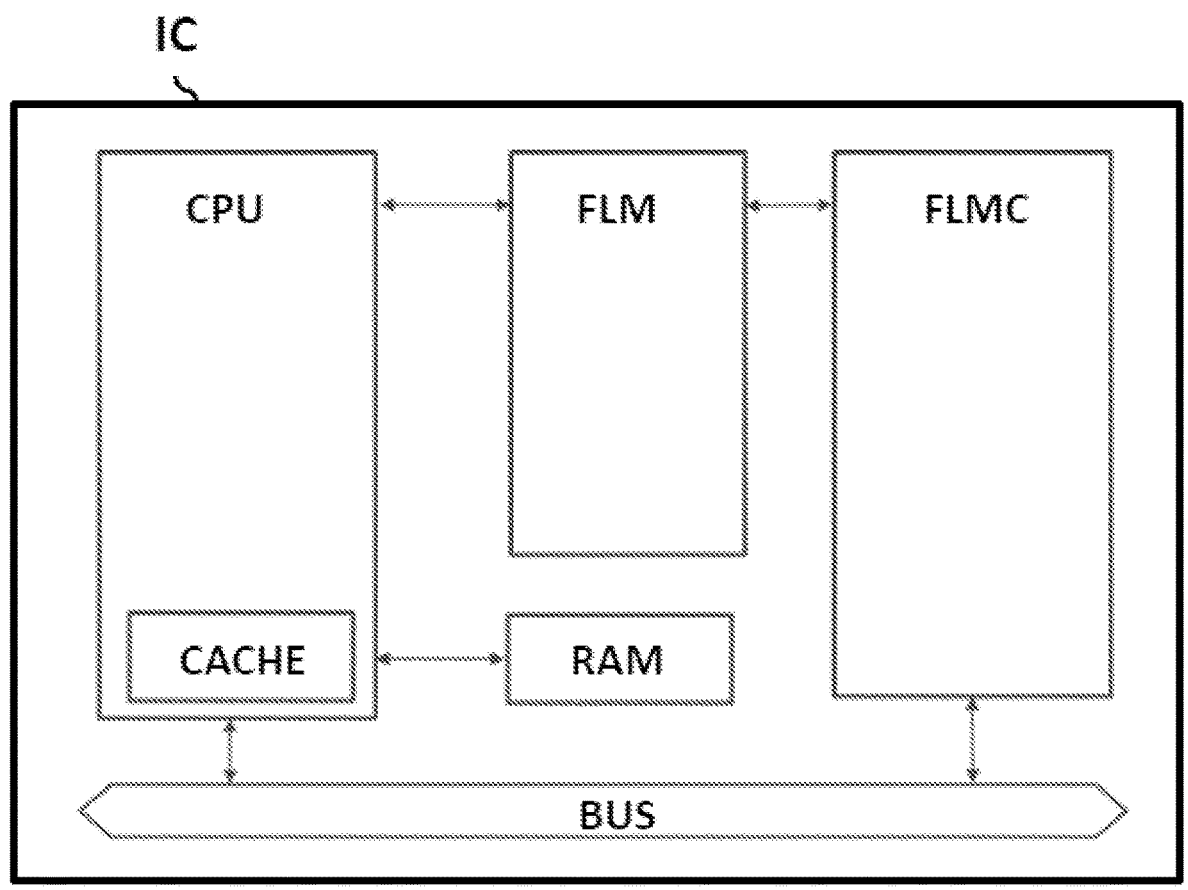

FIG. 1 is a block diagram illustrating a schematic configuration example of a semiconductor device according an embodiment.

Figure 2:
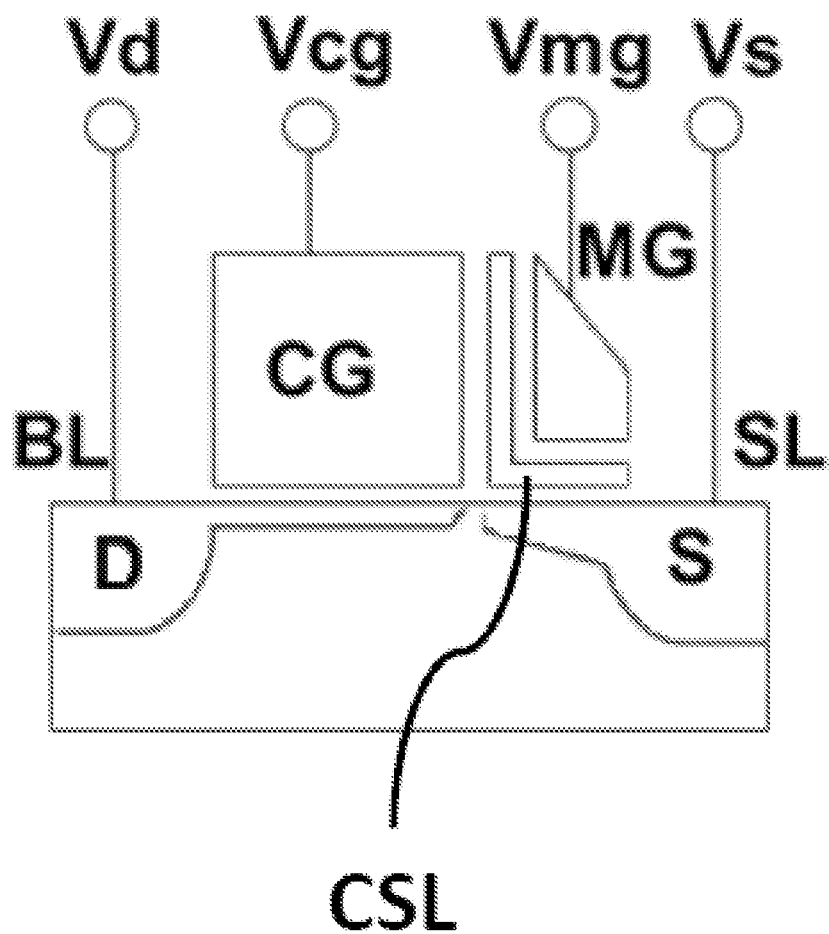

FIG. 2 is a sectional view illustrating a configuration example of a memory cell in a flash memory.

Figure 3:
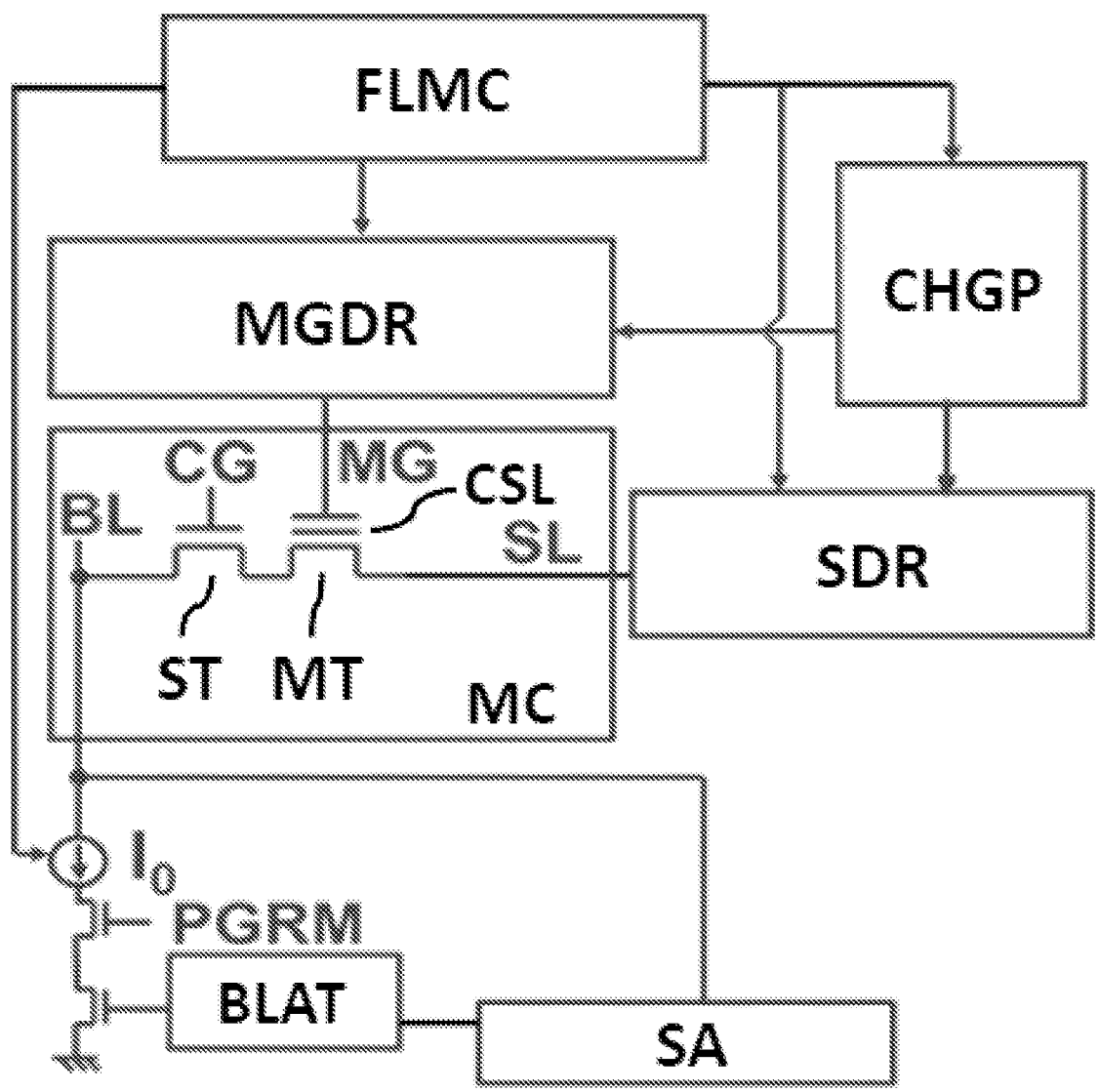

FIG. 3 is a block diagram illustrating a schematic configuration example of a flash memory and a memory controller.

FIG. 4 is a view illustrating one example of a voltage value applied to the memory cell.

Figure 5:
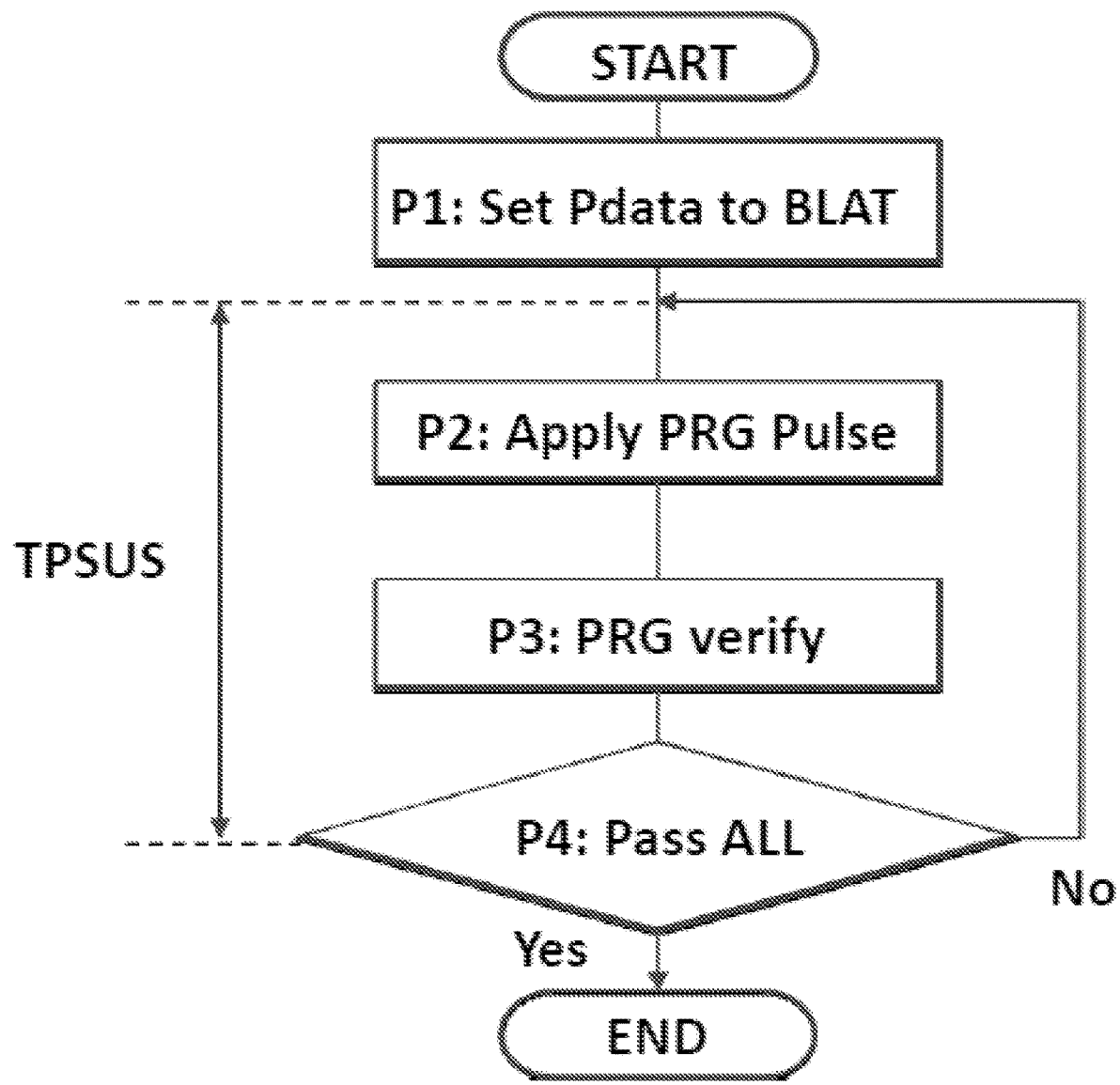

FIG. 5 is a view illustrating an operation flow of a writing operation.

Figure 6:
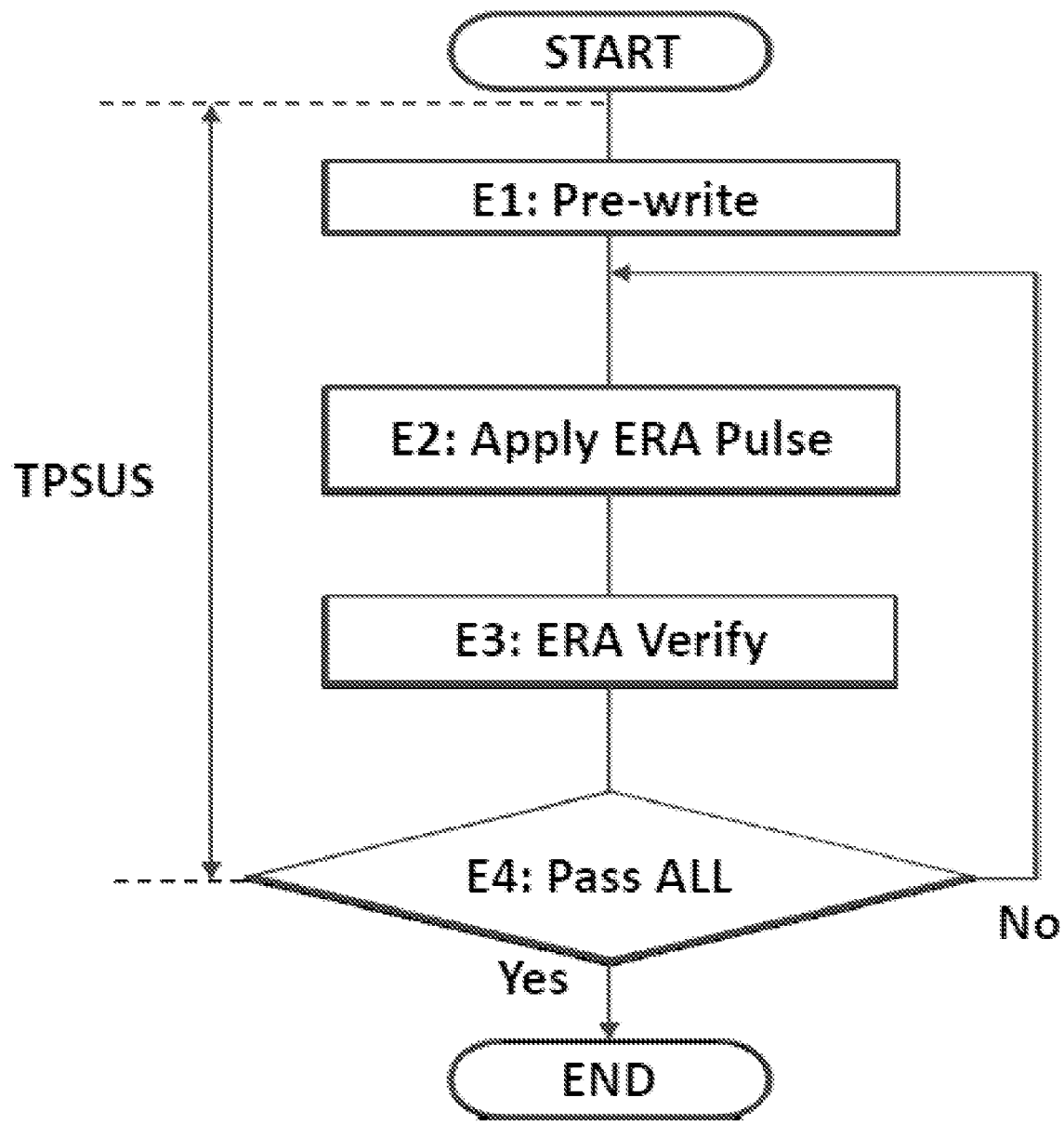

FIG. 6 is a view illustrating an operation flow of an erasing operation.

Figure 7:
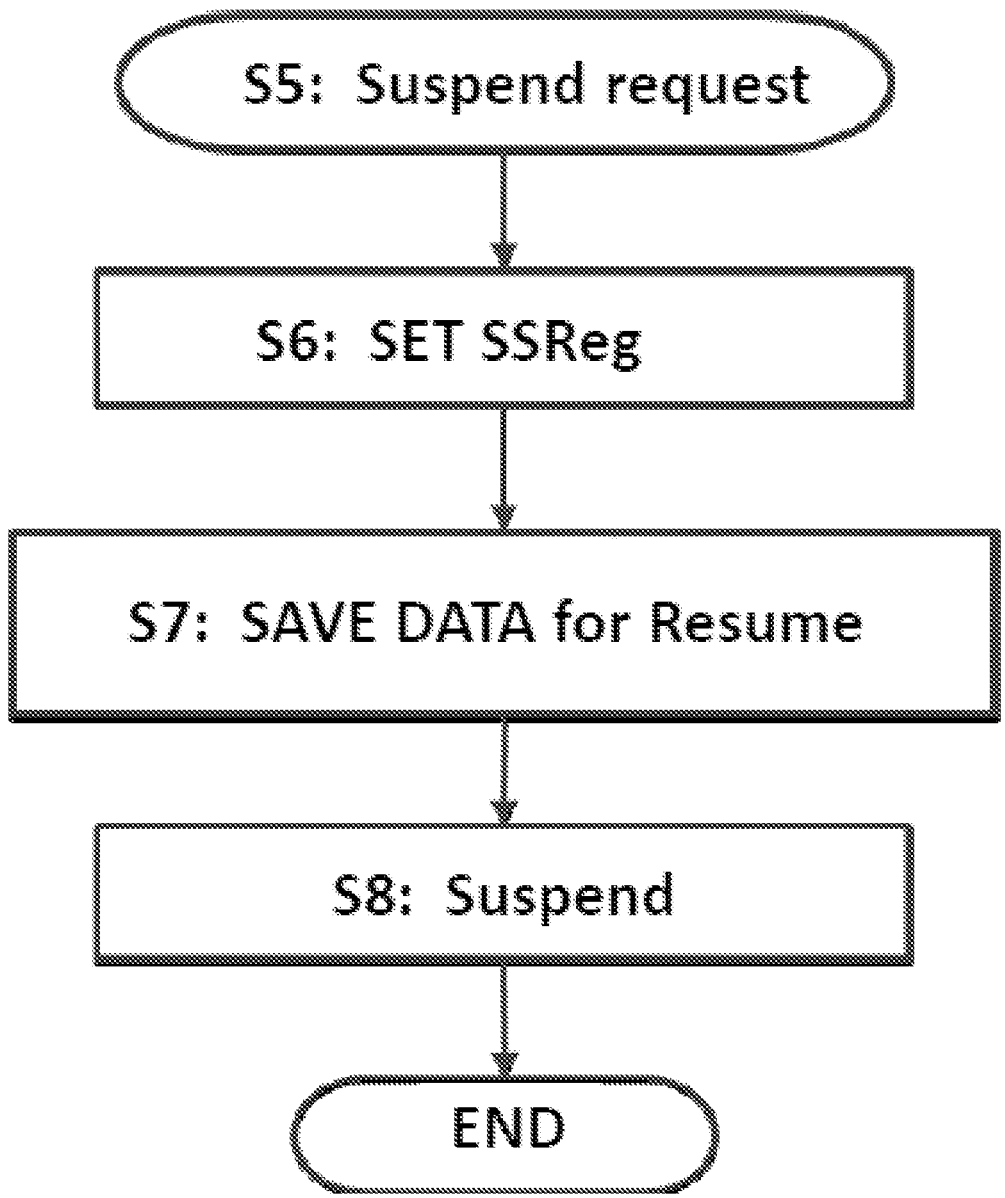

FIG. 7 is a view illustrating an interrupt processing flow when a suspension command is generated.

Figure 8:
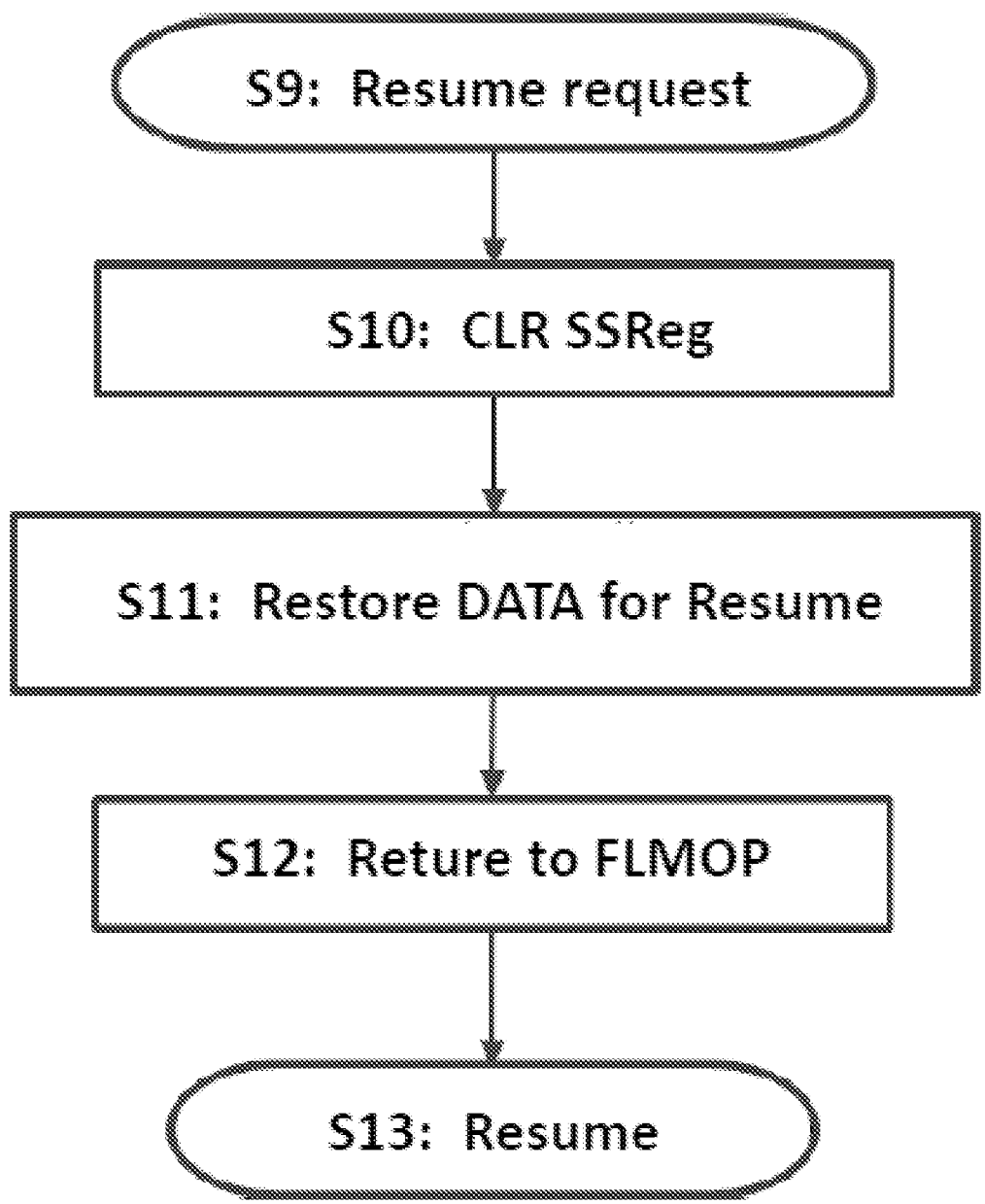

FIG. 8 is a view illustrating a processing flow when a resume command is issued.

FIG. 9 is a view for explaining transition of latched data in writing while the writing is suspended.

FIG. 10 is a view for explaining transition of latched data in erasing while writing is suspended.

Figure 11:
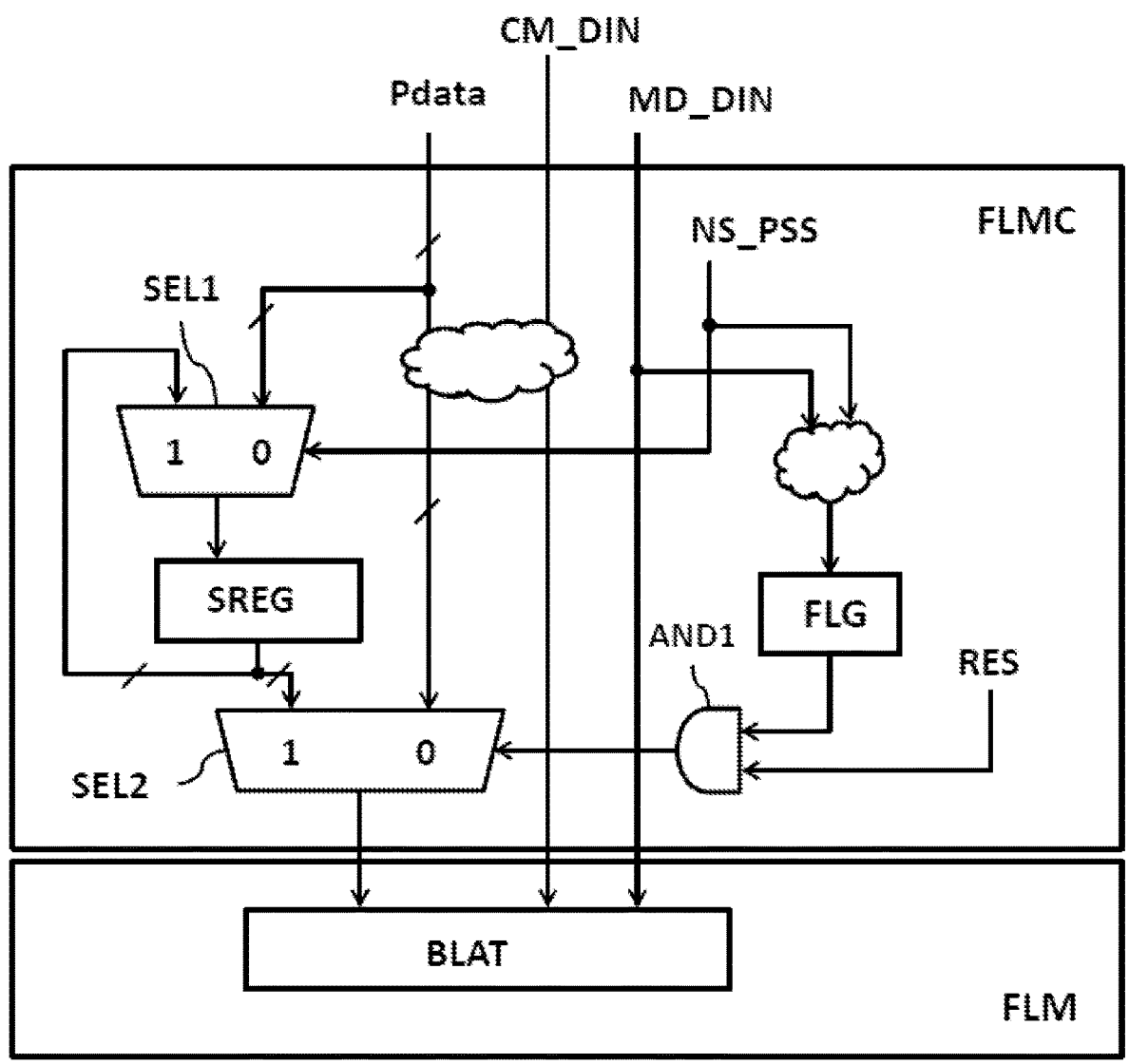

FIG. 11 is a view illustrating one example of a circuit configuration of a memory controller according to a first example.

Figure 12:
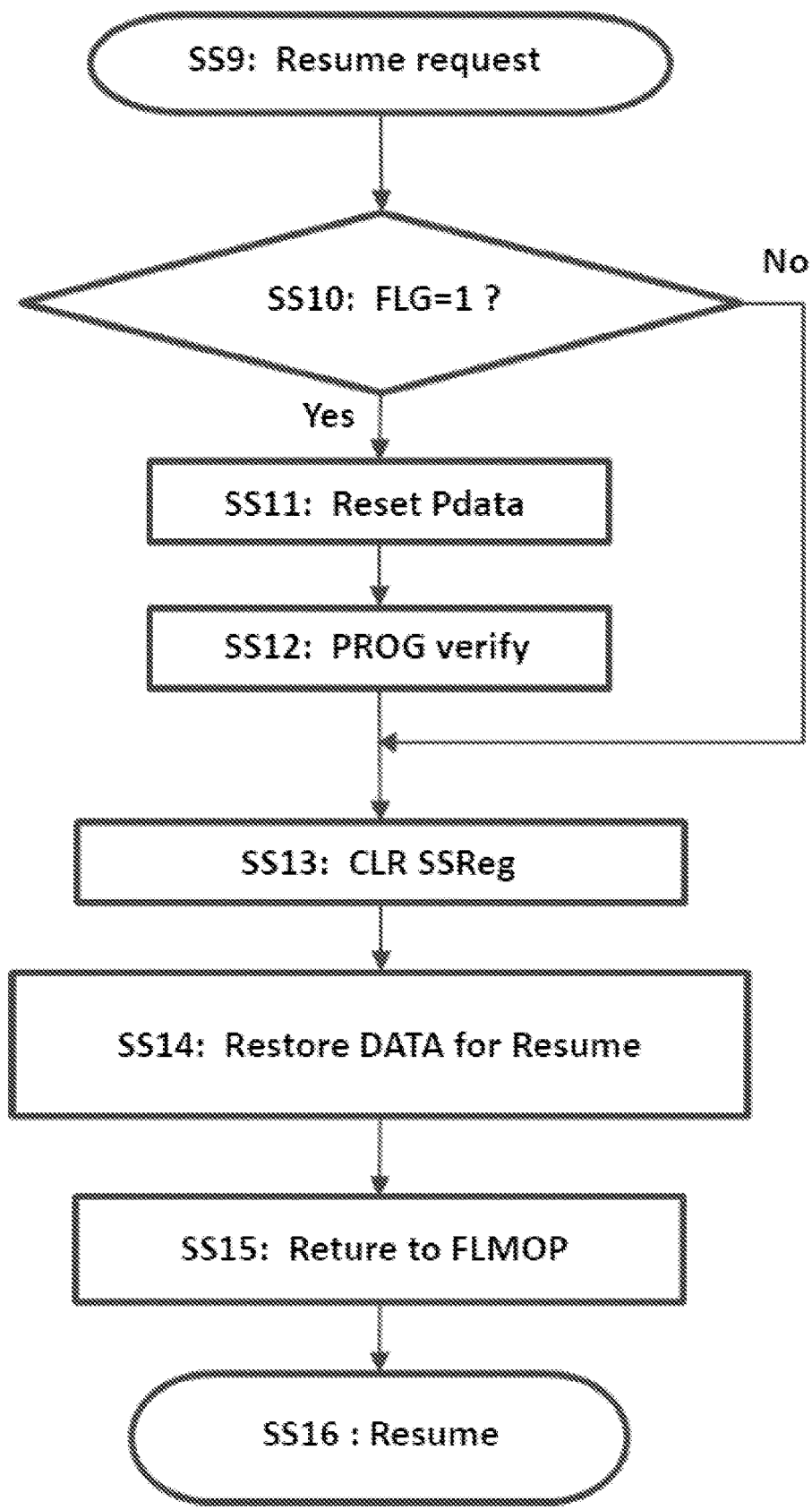

FIG. 12 is a view illustrating a processing flow at the time of issuing a resume command according to the first example.

FIG. 13 is a view for explaining transition of the latched data according to the first example.

Figure 14:
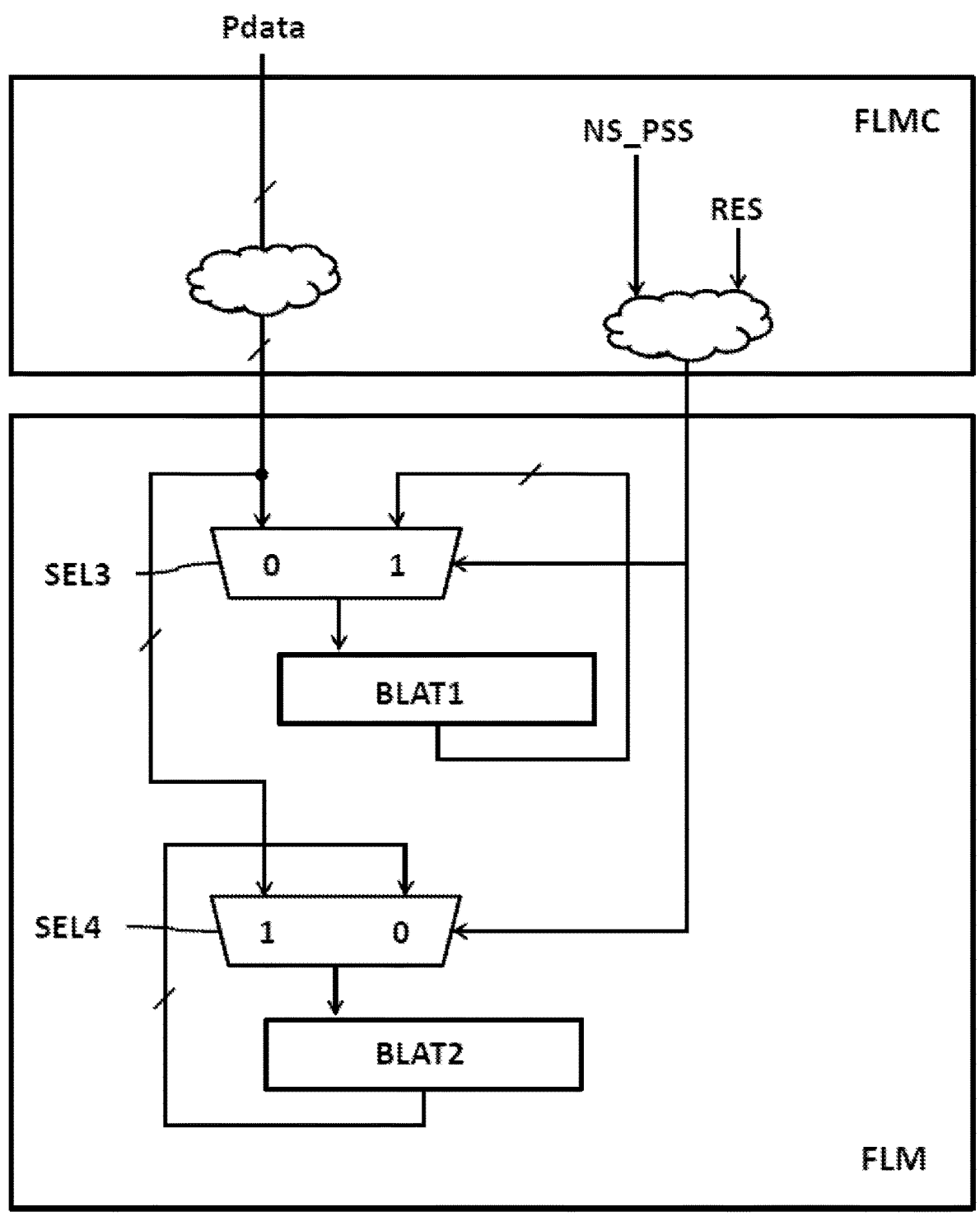

FIG. 14 is a view illustrating one example of a circuit configuration of a flash memory FLM according to a second example.

FIG. 15 is a view for explaining transition of latched data according to the second example.

Figure 16:
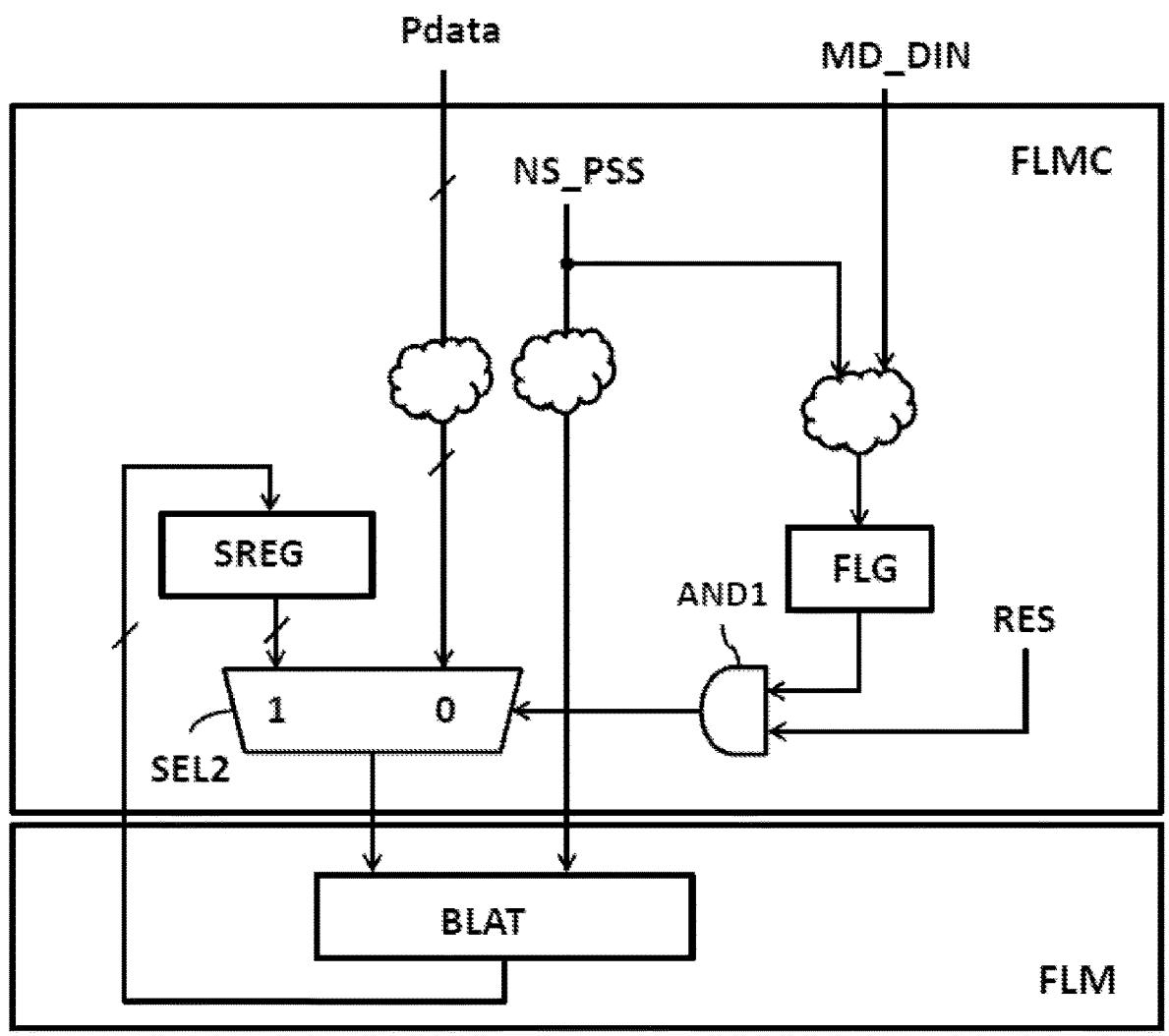

FIG. 16 is a view illustrating one example of circuit configurations of a memory controller FLMC and a flash memory FLM according to a third example.

Figure 17:
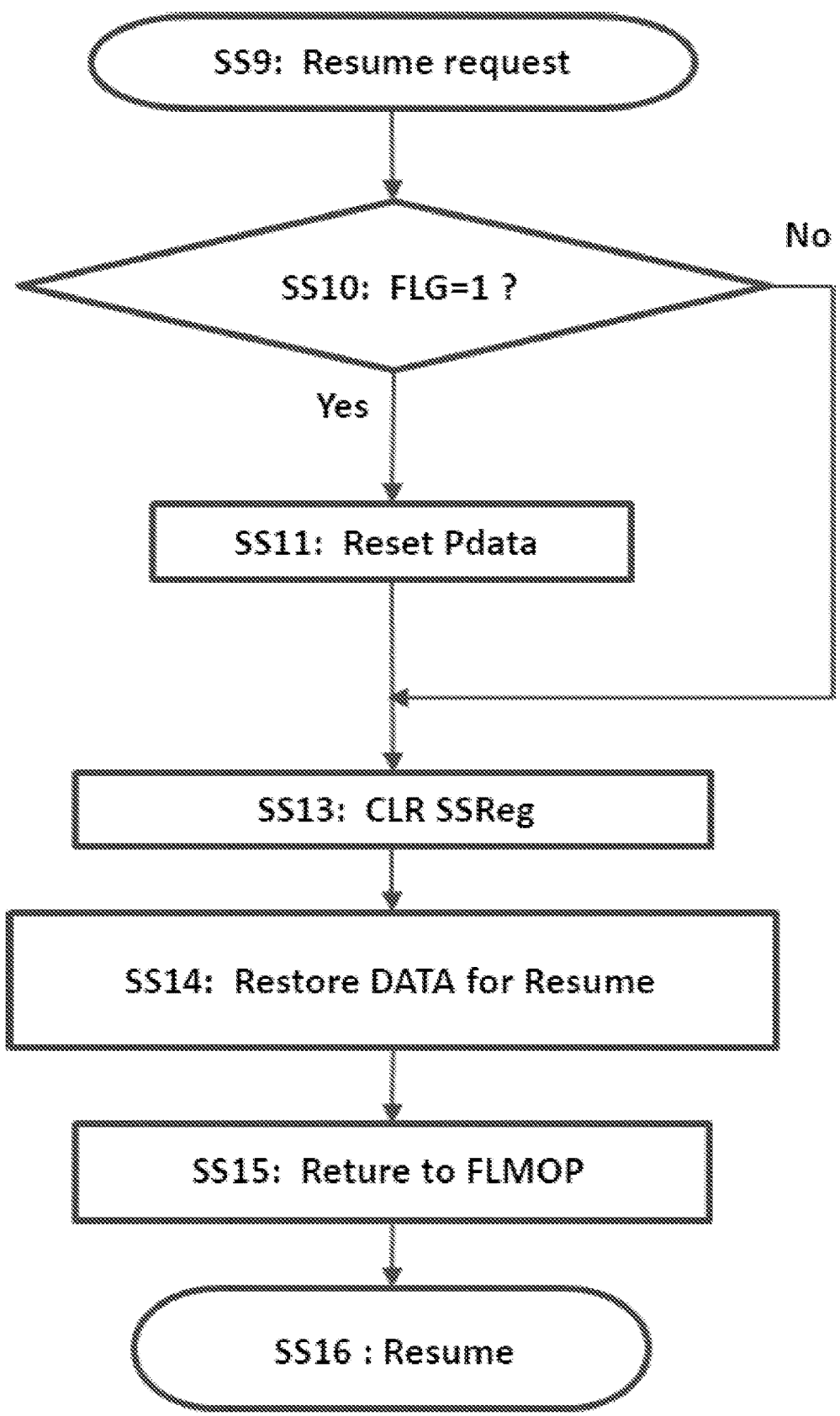

FIG. 17 is a view illustrating a processing flow at the time of issuing a resume command according to the third example.

FIG. 18 is a view for explaining transition of latched data according to the third example.

DETAILED DESCRIPTION

Hereinafter, an embodiment and examples will be described with reference to the drawings. Here, in the following description, the same reference numeral is applied to the same component, and repeated description thereof may be omitted. Note that in order to clarify the description, the drawings may be represented schematically compared with an actual embodiment. However, this is just one example, and does not limit interpretation of the present invention.

Embodiment (Whole Configuration of Semiconductor Device)

FIG. 1 is a block diagram illustrating a schematic configuration example of a semiconductor device. A semiconductor device IC includes a central processing unit CPU (hereinafter, referred to as a "CPU"), an RAM (Random Access Memory) that is a volatile memory, a memory controller FLMC, a flash memory FLM that is a nonvolatile memory, a peripheral bus BUS, and the like. As illustrated in FIG. 1, the CPU and the memory controller FLMC are connected to the peripheral bus BUS, and various kinds of information are inputted and outputted via the peripheral bus BUS.

The CPU is a functional block that executes arithmetic processing and the like related to controls of respective components of the semiconductor device IC. The CPU reads out a program stored in the flash memory FLM, and develops the program thus read out on the RAM. The CPU executes the program developed on the RAM, thereby realizing a functional block that performs each function. A cache memory CACHE is provided inside the CPU, and information frequently used in the arithmetic processing is stored in the cache memory CACHE.

As described above, the RAM is used to develop the program read out from the flash memory FLM, and temporarily store arithmetic processing data by the CPU.

The memory controller FLMC is a functional block for executing a control for the flash memory FLM. The memory controller FLMC executes processes regarding a writing operation, a reading operation, an erasing operation, and the like against the flash memory FLM.

Configuration Example of Memory Cell

FIG. 2 is a sectional view illustrating a configuration example of a memory cell MC in a flash memory FML. FIG. 3 is a block diagram illustrating a schematic configuration example of the flash memory FML and the memory controller FLMC. FIG. 4 is a view illustrating one example of a voltage value applied to a memory cell.

FIG. 2 illustrates only one nonvolatile memory cell (hereinafter, referred to as a "memory cell") MC for convenience sake. However, in fact, a plurality of memory cells MCs is arranged in an array. The plurality of memory cells MCs is arranged in a grid pattern along a bit line BL and a control gate CG illustrated in FIG. 2. The bit line BL extends in a Y direction, and the control gate CG extends in an X direction. More specifically, a plurality of bit lines BL each extending in the Y direction is provided in the flash memory FLM, and the plurality of bit line BL is arranged in the X direction. Further, a plurality of control gates CG each extending in the X direction is provided in the flash memory FLM, and the plurality of control gates CG is arranged in the Y direction. The plurality of memory cells MCs is arranged so as to correspond to respective intersections between the plurality of bit lines BL and the plurality of control gates CG.

As illustrated in FIG. 2 and FIG. 3, the memory cell MC includes a selection transistor ST and a memory transistor MT. One electrode of the selection transistor ST is connected to the bit line BL. One electrode of the memory transistor MT is connected to a source driver SDR via a source line SL. The other electrode of the selection transistor ST is connected to the other electrode of the memory transistor MT. Thus, in the memory cell MC, the selection transistor ST and the memory transistor MT are connected to each other in series between the source line SL and the bit line BL. The selection transistor ST includes the control gate CG, and the memory transistor MT includes a charge storage layer CSL and a memory gate MG. The memory gate MG is connected to a memory gate driver MGDR. As illustrated in FIG. 2, in the memory cell MC, the source line SL side is a source S, and the bit line BL side is a drain D.

A writing method of the flash memory FLM is a hot electron injection method in which a current flows between the drain D and the source S to trap a charge in the charge storage layer CSL. In the flash memory FLM, data "0" corresponds to a state where a threshold is high, and data "1" corresponds to a state where the threshold is low. The hot electron injection method is a method in which a high voltage is applied to the memory gate MG and the source line SL and the current flows between the drain D and the source S in a state where the charge can be easily trapped to trap the charge by the charge storage layer CSL, thereby becoming a state where the threshold of the memory cell MC is set to high. Namely, a value is written to the memory cell MC.

On the other hand, an erasing method of the flash memory FLM is executed by BTBT (Band to Band tunneling). By applying a plus voltage to the source line SL, applying a minus voltage to the memory gate MG, and causing holes to tunnel to the charge storage layer CSL, the holes and the trapped charges are recombined to eliminate the charges in the charge storage layer CSL.

FIG. 4 illustrates a voltage value example applied to the memory cell MC. By applying the voltage values described in FIG. 4 thereto, it is possible to execute a writing operation (PROG), an erasing operation (ERASE), or a reading operation (READ) against the memory cell MC. In FIG. 4, Vd indicates a voltage value of the bit line BL or the drain D; Vcg indicates a voltage value of the control gate CG; Vmg indicates a voltage value of the memory gate MG; and Vs is a voltage value of the source line SL or the source S.

A sense amplifier SA is a functional block that executes a determining process of whether a writing operation or an erasing operation against the memory cell MC is completed or not. For example, the sense amplifier SA is provided for each bit line BL. Each of the sense amplifiers SA is connected to the corresponding bit line BL and a bit latch circuit (hereinafter, referred to as "bit latch") BLAT of a corresponding switching circuit. A reading operation is executed after the writing operation or the erasing operation. The sense amplifier SA compares a current flowing into the bit line BL by the reading operation, for example, with a current of a reference signal supplied from the memory controller FLMC. Such processing is called verification. For example, in a case where the current flowing into the bit line BL is larger than the current of the reference signal, the sense amplifier SA determines that predetermined data are written to the memory cell MC, and outputs a writing completion signal to the bit latch BLAT.

(Writing Operation)

FIG. 5 is a view illustrating an operation flow of a writing operation. First, writing data (Pdata) for a program are transferred to the bit latch BLAT of the flash memory FLM from the CPU (P1) (hereinafter, referred to also as "data in"). Next, a writing pulse (PRG pulse) is applied (P2), writing verification (PRG verify) is executed (P3), and writing verification determination is executed (P4). When the writing verification for all bits is passed (Yes) (P4), the writing operation is completed (END). The processes of the writing pulse application (P2), the writing verification (P3), and the writing verification determination (P4) are repeated until the writing verification for all bits is passed (No). There is a function of masking the writing pulse application (P2) and the verification execution (P3) for the memory cell MC thereafter by inverting the data stored in the bit latch BLAT for the memory cell MC for which it can be confirmed that the writing is completed by the writing verification at the time of the writing verification. This is called a verification mask function. The present invention also corresponds to this verification mask function. The present invention can of course be applied even in a case where there is no verification mask function.

(Erasing Operation)

FIG. 6 is a view illustrating an operation flow of an erasing operation. The erasing does not require data in from the CPU. However, in order to avoid overerased cells from being created, all of the memory cells MC in the erased block are written to a high threshold level (E1). This is called as "prewriting". Latched data are set to "All 0" in order to execute the prewriting (E1), and pulse application is executed in the similar manner to the writing. When the prewriting is completed, an erasing pulse (ERA Pulse) is applied in the similar manner to the writing (E2); erasure verification is executed (E3); and verification determination is executed (E4). When the erasure verification for all bits is passed (Yes), the erasure is completed (END). The processes of the erasing pulse application (E2), the erasure verification (E3), and erasure verification determination (E4) are repeated until the erasure verification for all bits is passed (No).

(Interrupt Processing Flow when Suspension Command is Generated and Processing Flow when Resume Command is Issued)

FIG. 7 is a view illustrating an interrupt processing flow when a suspension command is generated. FIG. 8 is a view illustrating a processing flow when a resume command is issued.

When a suspension command SUSCMD is issued from the CPU during a suspension receiving period TPSUS illustrated in FIG. 5 and FIG. 6, an interrupting and suspending process is executed for a writing process or an erasing process. FIG. 7 illustrates a flow representing the processing content to be executed at that time. When interruption based on the suspension command SUSCMD is generated (S5), a suspended state register SSReg is set (S6); data necessary for restoring the interrupted process such as a command start address or selected macro information are saved at the time of resume (S7); and suspension is completed by executing an interrupting process for the flash memory FLM (S8).

When a resume command RESCMD is issued from the CPU, as illustrated in FIG. 8, resume processing is executed. In the resume processing, processes, such as a resume request is made on the basis of the resume command RESCMD (S9); the suspended state register SSReg is cleared for the processes that was executed at the time of a suspension flow (S10); restoring of save information (such as the command start address or selected macro information) (S11); a restoring process of a flash operation FLMOP (S12); or restart from an interrupted portion (S13), are executed.

(Explanation of Problems)

FIG. 9 is a view for explaining transition of latched data in writing while the writing is suspended. FIG. 10 is a view for explaining transition of latched data in erasing while writing is suspended. In FIG. 9 and FIG. 10, writing data of the bit latch BLAT when a writing command is issued (P1) are referred to as data A, and latched data of the bit latch BLAT when first verification (P3 (first time)) is ended are referred to as data B. Further, latched data of the bit latch BLAT when the writing command described above is completed are referred to as data C; writing data of the bit latch BLAT to the same macro in a writing suspended state are referred to as data D; and latched data of the bit latch BLAT when the writing is completed are referred to as data E. Moreover, FIG. 9 and FIG. 10 illustrate transition tables of the latched data of the bit latch BLAT by a suspended writing operation or erasing operation by assuming that suspension occurs at timing when application of a second writing pulse is ended (with respect to data transition tables (FIG. 13, FIG. 15, and FIG. 18) illustrated below, the suspension occurs at the same timing). The writing process, the erasing process, and the suspending process in the flows described in FIG. 9 and FIG. 10 respectively correspond to the operation flows illustrated in FIG. 5, FIG. 6, and FIG. 7.

At P2 and P3, a value of the bit latch circuit of the bit latch BLAT that corresponds to the memory cell for which the writing is completed by the writing pulse application and the verification execution is inverted and restored (verification mask), whereby the value of the bit latch BLAT varies from the data A to the data B. In the writing suspended state, the latched data of the bit latch BLAT set to the flash memory FLM remains held. For that reason, when a data in operation is executed for the bit latch BLAT in order to execute the writing command to the same macro at the time of the writing suspended state, the latched data of the bit latch BLAT varies from the data B to the data D in FIG. 9, and a resume operation cannot be executed. Further, as illustrated in FIG. 10, when an erasing command is executed for the same macro at the time of the writing suspended state, the latched data of the bit latch BLAT varies from the data B to "All 0" for prewriting (E1), and the resume operation cannot be executed. Here, in this specification, the same macro indicates one flash memory FLM, or one memory bank in the flash memory FLM including a plurality of memory banks.

The present invention provides a method of restoring the latched data of the bit latch BLAT during suspension at the time of the resume operation after the writing operation or the erasing operation is executed during the writing suspended state for the same macro. A data restoring method of the bit latch BLAT is similar between after the writing operation and after the erasing operation while the writing is suspended. For this reason, hereinafter, a case of the writing operation will be described as a representative example. However, this does not exclude a case of the erasing operation. Note that the plurality of memory cells MCs includes a plurality of first memory cells and a plurality of second memory cells. The plurality of first memory cells is memory cells to which writing data are written at the time of the writing. The plurality of second memory cells is memory cells that are targets of the writing operation or the erasing operation during a state where the writing of the writing operation to the plurality of first memory cells is suspended.

First Example

Execution of a writing command or an erasing command in a writing suspended state is supported in the same macro. For that reason, an additional circuit for holding the writing data Pdata transferred from the CPU is provided in any place other than the flash memory FLM, for example, provided in the memory controller FLMC. FIG. 11 is a view illustrating one example of a circuit configuration of the memory controller FLMC. The circuit configuration illustrated in FIG. 11 is just one example, and the circuit may be changed in accordance with data in protocol if the data in protocol is different.

As illustrated in FIG. 11, the memory controller FLMC includes a register for save (hereinafter, referred to as a "saved register") SREG, a data in generation flag FLG, a first selection circuit SEL1, a second selection circuit SEL2, and an AND circuit AND1. The flash memory FLM includes the bit latch BLAT.

The memory controller FLMC is configured so as to receive the writing data Pdata, a data-in command CM-DIN, and a data-in mode signal MD_DIN from the CPU. Further, the memory controller FLMC is configured so as to set a writing suspended state notification signal NS_PSS from a "0" state to a "1" state when the suspension command SUSCMD is issued from the CPU in a writing state. In a case where it is not the writing suspended state, the writing suspended state notification signal NS_PSS is set to the "0" state.

When data in is generated during the writing suspended state, the data in generation flag FLG is set from a "0" state to a "1" state on the basis of the "1" state of the writing suspended state notification signal NS_PSS and a "1" state of the data-in mode signal MD_DIN.

An input terminal indicated by "0" of the first selection circuit SEL1 is configured so as to receive the writing data Pdata, and an input terminal indicated by "1" of the first selection circuit SEL1 is connected to an output terminal of the saved register SREG. An output terminal of the first selection circuit SEL1 is connected to an input terminal of the saved register SREG. A selection operation of the first selection circuit SEL1 is controlled on the basis of the writing suspended state notification signal NS_PSS. In a case where the writing suspended state notification signal NS_PSS is in the "0" state, the input terminal indicated by "0" of the first selection circuit SEL1 is connected to the output terminal of the first selection circuit SEL1. In a case where the writing suspended state notification signal NS_PSS is in the "1" state, the input terminal indicated by "1" of the first selection circuit SEL1 is connected to the output terminal of the first selection circuit SEL1.

An input terminal indicated by "0" of the second selection circuit SEL2 is configured so as to receive the writing data Pdata, and an input terminal indicated by "1" of the second selection circuit SEL2 is connected to the output terminal of the saved register SREG. An output terminal of the second selection circuit SEL2 is connected to an input terminal of the bit latch BLAT. A selection operation of the second selection circuit SEL2 is controlled on the basis of an output of the AND circuit AND1. In a case where the output of the AND circuit AND1 is in a "0" state, the input terminal indicated by "0" of the second selection circuit SEL2 is connected to the output terminal of the second selection circuit SEL2. In a case where the output of the AND circuit AND1 is in a "1" state, the input terminal indicated by "1" of the second selection circuit SEL2 is connected to the output terminal of the second selection circuit SEL2.

The AND circuit AND1 is configured so as to receive an output signal of the data in generation flag FLG and a resume signal RES. When the resume command RESCMD is issued from the CPU, the resume signal RES is set to a "1" state. When the data in generation flag FLG is set to the "1" state and the resume signal RES is set to the "1" state, an output signal of the AND circuit AND1 is set to a "1" state. Otherwise, the output signal of the AND circuit AND1 is set to a "0" state.

In a case where it is not the writing suspended state (the writing suspended state notification signal NS_PSS is in the "0" state), the memory controller FLMC transfers the writing data Pdata transferred together with the data-in command (CM DIN) from the CPU to the bit latch BLAT of the flash memory FLM, and transfers them to the saved register SREG at the same time. During the writing suspended state (when the writing suspended state notification signal NS_PSS is in the "1" state), the memory controller FLMC does not transfer any data to the saved register SREG, but transfers the writing data Pdata to only the bit latch BLAT of the flash memory FLM. Further, when the data in occurs during the writing suspended state, the data in generation flag FLG is set to the "1" state. Then, at the time of resume (when the resume signal RES is in the "1" state), a transfer source of the data Pdata is switched from the CPU to a path of the saved register SREG by the data in generation flag FLG and the resume signal.

FIG. 12 is a view illustrating a processing flow at the time of issuing a resume command according to the first example. FIG. 13 is a view for explaining transition of the latched data according to the first example. Note that since explanation of FIG. 9 can be referred to for writing illustrated in FIG. 13 and writing while the writing is suspended, repeated explanation will be omitted.

When the resume command RESCMD is issued from the CPU, as illustrated in FIG. 12, resume processing is executed. In the resume processing, a resume request is made on the basis of the resume command RESCMD (SS9). Next, it is determined whether the data in generation flag FLG is set to "1" or not (SS10). In a case where the data in generation flag FLG is set to "1" (Yes), the processing flow shifts to SS11. In a case where the data in generation flag FLG is not set to "1" (No), the processing flow shifts to SS13.

At SS11, a process (SS11) of resetting the writing data Pdata (A) stored in the saved register SREG to the bit latch BLAT of the flash memory FLM is executed. Then, in consideration of the verification mask, writing verification is executed in order to restore the reset latched data Pdata (A) to the latched data (B) at the time of suspension (SS12).

Next, processes of clear of the suspended state register SSReg (SS13), restoring of the save information (such as the command start address or the selected macro information) (SS14), the restoring process of the flash operation FLMOP (SS15), and restart from the interrupted portion (SS16) are executed for the processes executed at the time of the suspending operation flow.

As illustrated in FIG. 12 and FIG. 13, the data in generation flag FLG is set by executing writing while the writing is suspended, and the process (SS11) of resetting the writing data Pdata (A) to the bit latch BLAT of the flash memory FLM by using the data Pdata (A) stored in the saved register SREG is executed before processes at the time of resume are started are executed. Further, in consideration of the verification mask, verification is executed in order to restore the reset latched data Pdata (A) to the latched data (B) at the time of suspension (SS12). The latched data (A) and the memory cell MC are compared with each other by the verification (SS12). If the memory cell MC is written, the latched data (A) are inverted, and it is possible to restore them to the state of the latched data (B) at the time of suspension. In FIG. 13, since timing of suspending is after application of a writing pulse and before writing verification, the latched data (A) is changed into the latched data (C) by the verification (SS12) at the time of resume. At the other timing, it is possible to restore them to the state at the time of suspension.

According to the first example, the following effects can be obtained.

1) By merely providing an additional circuit in the memory controller FLMC, it is possible to support the writing operation while the writing is suspended and the erasing operation while the writing is suspended.

2) In the above 1), it is possible to use the flash memory FLM, which is a design asset before the present invention, as it is, and this makes it possible to suppress a design cost from increasing.

3) With respect to a suspension response time that increases due to the processes such as reset of the writing data (SS11) or the writing verification (SS12) for restoring verification mask information, measures can be taken to prevent deterioration by receiving suspension even during resume flow processing.

Second Example

Next, a second example will be described. FIG. 14 is a view illustrating one example of a circuit configuration of the flash memory FLM according to the second example. In the second example, as illustrated in FIG. 14, two bit latches (BLAT1, BLAT2) and two selection circuits (SEL3, SEL4) are provided inside the flash memory FLM. The first selection circuit SEL3 and the second selection circuit SEL4 are configured so that a selection operation thereof is controlled on the basis of the writing suspended state notification signal NS_PSS and the resume signal RES.

At the time of execution of suspension, or at the time of reception of the writing command or the erasing command while the writing is suspended, latched data of a first bit latch BLAT1 are saved in a second bit latch BLAT2, or a writing destination of data and internal reference are switched to the second bit latch BLAT2. Then, at the time of resume, by restoring the latched data from the second bit latch BLAT2 to the first bit latch BLAT1, or by setting the writing destination and the internal reference to the first bit latch BLAT1, they are restored to the state at the time of suspension.

In order to switch or save paths by the signal (NS_PSS, RES), a restoring process of the latched data is completed at high speed compared with the first example or a third example (will be described later). FIG. 15 is a view for explaining transition of the latched data according to the second example. A difference between FIG. 15 and FIG. 13 is that there is no need to add the processes of reset of writing data (SS11) and verification (SS12) at the time of resume, which are executed in FIG. 13, in order to save information containing the latched data inverted by verification mask or switch it into another bit latch. For that reason, as an operation flow at the time of resume, the operation flow illustrated in FIG. 8 can be used as it is instead of the operation flow illustrated in FIG. 12.

Third Example

Next, a third example will be described. FIG. 16 is a view illustrating one example of circuit configurations of the memory controller FLMC and the flash memory FLM according to the third example. FIG. 17 is a view illustrating a processing flow at the time of issuing a resume command according to the third example. FIG. 18 is a view for explaining transition of latched data according to the third example.

As illustrated in FIG. 16, a read mechanism is provided in the bit latch BLAT. The memory controller FLMC reads the latched data of the bit latch BLAT of the flash memory FLM at the time of suspension or at the time of reception of a writing command or an erasing command while suspended, and stores or saves the read latched data in the saved register SREG provided in the memory controller FLMC. Similar to the first example, the second selection circuit SEL2 and the data in generation flag FLG are provided. When resume is executed in a state where the data in generation flag FLG is set to a "1" state, the latched data saved in the saved register SREG by the memory controller FLM at the time of the resume are reset to the bit latch BLAT of the flash memory FLM.

FIG. 17 is substantially the same processing as that illustrated in FIG. 12. However, since a process of restoring the verification mask information is not required, the verification process (SS12) illustrated in FIG. 12 is not required. In the flash memory FLM in which the verification mask function is mounted, the latched data are inverted and restored when the writing is completed, and it is possible to save and restore information containing verification mask when the latched data are read. As a unique effect of the third example, it is possible to suppress an area from increasing compared with the second example in which the two bit latches BLAT are held as they are.

Fourth Example

A circuit configuration according to a fourth example is not changed from that illustrated in FIG. 1. In the first to third examples, the additional circuit is provided in the memory controller FLMC or the flash memory FLM to hold the writing data Pdata. However, in the fourth example, the CPU holds the writing data Pdata; transfers the writing data Pdata to the flash memory FLM before the resume again; and issues a resume command RESCMD. Ina case where the flash memory FLM is equipped with a verification mask function, the memory controller FLMC executes verification when the resume command RESCMD is received; restores verification mask information to a state at the time of suspension; and continues resume processing.

As described above, the invention made by the inventors of the present application has been described on the basis of the examples. However, the present invention is not limited to the embodiment described above and the examples described above, and it goes without saying that various modifications may be made.

What is claimed is:

1. A semiconductor device comprising:
a nonvolatile memory cell including a plurality of first memory cells and a plurality of second memory cells;
a bit latch; and
a saved register, wherein
in a first writing operation, first writing data are simultaneously stored in both the bit latch and the saved register, and writing to the plurality of first memory cells is executed on a basis of the first writing data stored in the bit latch,
during the first writing operation, in response to the first writing operation being interrupted on a basis of a suspension command, a second writing operation is executed,
in the second writing operation, second writing data are stored in the bit latch, and writing to the plurality of second memory cells is executed on a basis of the second writing data, and
after the second writing operation is ended, the first writing data of the saved register is reset to the bit latch on a basis of a resume command, and the interrupted first writing operation is restarted on a basis of the first writing data reset to the bit latch.

2. The semiconductor device according to claim 1, wherein writing verification for the plurality of first memory cells is executed to cause the first writing data, which were reset to the bit latch, restore to the data at a time of suspension.

3. The semiconductor device according to claim 1, further comprising:
a flash memory including the bit latch and the nonvolatile memory cell; and
a memory controller configured to execute processes regarding a writing operation, a reading operation, and an erasing operation against the flash memory,
wherein the saved register is provided in the memory controller.

4. The semiconductor device according to claim 3, further comprising:
a CPU,
wherein the CPU is configured to generate the suspension command and the resume command.

5. A semiconductor device comprising:
a nonvolatile memory cell including a plurality of first memory cells and a plurality of second memory cells;
a first bit latch; and
a second bit latch, wherein
in a first writing operation, first writing data are stored in the first bit latch, and writing to the plurality of first memory cells is executed on a basis of the first writing data stored in the first bit latch,
during the first writing operation, in response to the first writing operation being interrupted on a basis of a suspension command, a second writing operation is executed,
in the second writing operation, second writing data are stored in the second bit latch, and writing to the plurality of second memory cells is executed on a basis of the second writing data, wherein the second writing data are stored in the second bit latch in response to receiving a second writing operation command while the first writing operation is interrupted, and
after the second writing operation is ended, the interrupted first writing operation is restarted on a basis of a resume command and latched data of the first bit latch.

6. The semiconductor device according to claim 5, further comprising:
a flash memory including the first bit latch, the second bit latch, and the nonvolatile memory cell; and
a memory controller configured to execute processes regarding a writing operation, a reading operation, and an erasing operation against the flash memory.

7. A semiconductor device comprising:
a nonvolatile memory cell including a plurality of first memory cells and a plurality of second memory cells;
a bit latch; and
a saved register, wherein
in a first writing operation, first writing data are stored in the bit latch, and writing to the plurality of first memory cells is executed on a basis of the first writing data stored in the bit latch,
during the first writing operation, in response to the first writing operation being interrupted on a basis of a suspension command and a writing command being received while the first writing operation is interrupted, the first writing data stored in the bit latch are saved in the saved register, and a second writing operation is executed,
in the second writing operation, second writing data are stored in the bit latch, and writing to the plurality of second memory cells is executed on a basis of the second writing data, and
after the second writing operation is ended, the data saved in the saved register are reset to the bit latch on a basis of a resume command, and the interrupted first writing operation is restarted on a basis of the data reset to the bit latch.

8. The semiconductor device according to claim 7, further comprising:
- a flash memory including the bit latch and the nonvolatile memory cell; and
- a memory controller configured to execute processes regarding a writing operation, a reading operation, and an erasing operation against the flash memory,
- wherein the saved register is provided in the memory controller.

* * * * *